Feb. 24, 1970 J. K. GUSCOTT ET AL 3,497,626

SIGNALING SYSTEM HAVING GAIN/SLOPE ADJUSTMENT FOR AMPLIFIER

Filed April 18, 1966

United States Patent Office 3,497,626

Patented Feb. 24, 1970

3,497,626

SIGNALING SYSTEM HAVING GAIN/SLOPE ADJUSTMENT FOR AMPLIFIER

John Kenneth Guscott, Stamford, Conn., and Ivan Lee Perlman, Mount Kisco, N.Y., assignors to Litton Systems, Inc., Beverly Hills, Calif., a corporation of Maryland

Filed Apr. 18, 1966, Ser. No. 543,311

Int. Cl. H01j *1/02*

U.S. Cl. 179—15 3 Claims

ABSTRACT OF THE DISCLOSURE

A gain control system for a signal amplifier having a light-sensitive resistor in the feedback circuit, a lamp and an adjustable light-masking device or shutter interposed between the lamp and the light-sensitive resistor to vary the gain/slope characteristic of the amplifier. In a multichannel signalling system, by matching the gain/slope characteristics of the amplifiers in each channel, switching means arranged to connect the gain control circuits of the respective channels permits the gain control circuit of one (master) channel to control the gain of the other (slave) channels. Multichannel gain control of two or more amplifiers can be employed if the rate of change of the gain of each amplifier is approximately the same.

Figure 1:
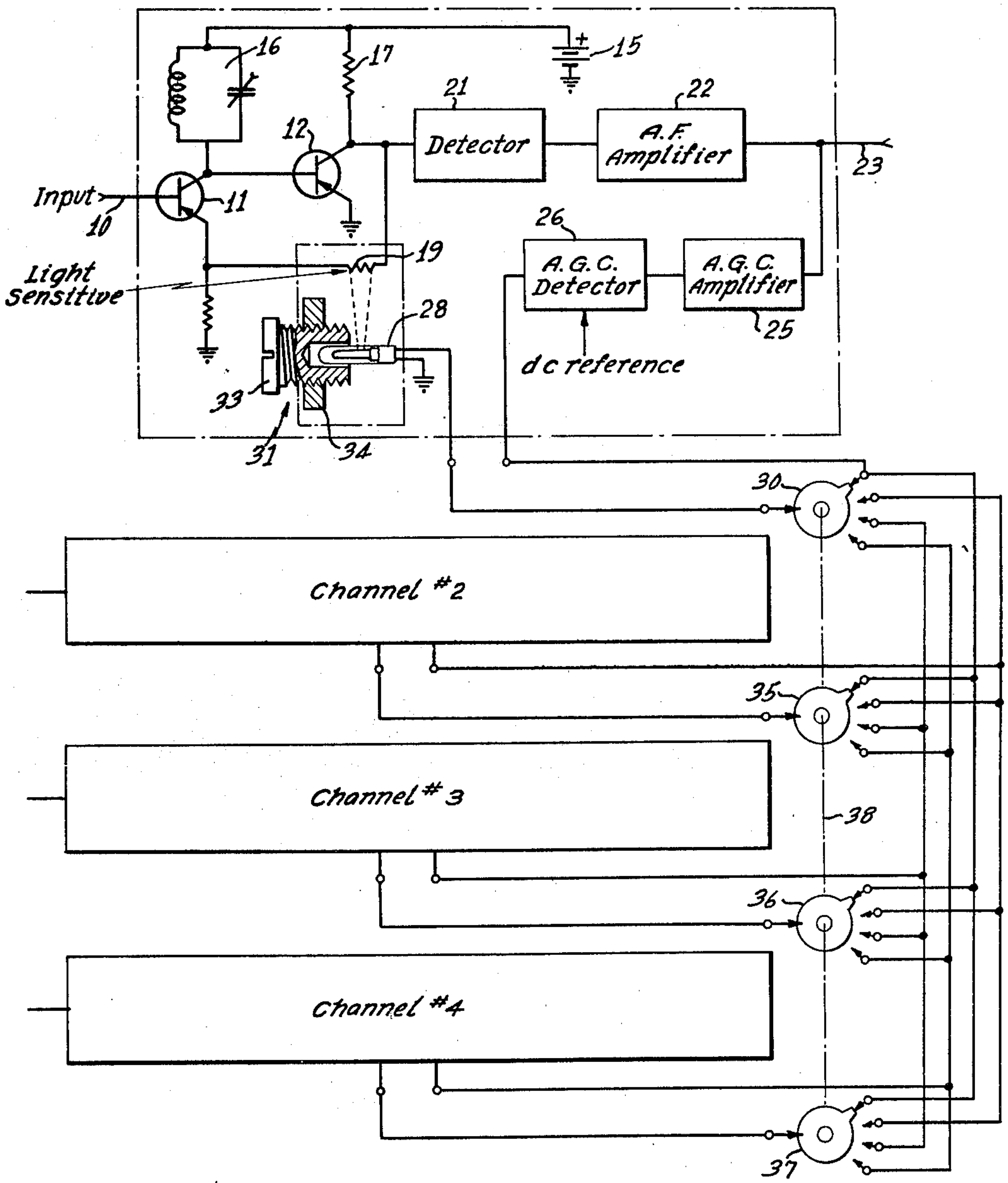

This invention relates to multi-channel signaling systems and, more particularly, to a gain control system for one or more channels of a communication system.

In a signal amplifier for voice or other communication systems, it is known to control the gain of the amplifier by a negative feedback circuit containing variable resistance. For example, a light-sensitive resistor may be employed which changes resistance and thus varies the gain of the amplifier in response to changes of the intensity of light from a lamp which is connected to the output circuit of the amplifier and disposed in a position to illuminate the resistor.

In accordance with the present invention, the rate of change of gain or the gain/slope characteristic of the amplifier is controlled in a feedback arrangement of this kind with a light-masking device or shutter. The adjustment of the shutter controlling the illumination of the light-sensitive resistor provides a fine adjustment of the gain/slope characteristic of the amplifier which has the advantage that the gain/slope characteristics of two or more amplifier stages in a multiplex system may be precisely matched.

Where a signaling system includes a plurality of channels, it is often advantageous to control the gain of all channels by the feedback potential of a single or master channel. The controlled or slave channels are tied into the gain control circuit of the master channel. This is particularly desirable in the case where one channel is a telegraph channel and other channels are voice channels since the signal on the telegraph channel is substantially uninterrupted and thus provides a steady gain control voltage. It is well known that such an interconnection of master and slave channels, however, can only be employed without difficulty where the gain/slope characteristics of all the channels are alike or substantially identical. It is thus a further object of the invention to improve the operation of multiplexed channels by interconnecting the gain control circuits so that all channels are controlled by the gain control voltage of a single channel.

A still further object of the invention is to provide switching means for effectively interconnecting the gain control circuits of two or more channels in a multiplex signal amplifying system, or to utilize the gain control system of one amplifier channel to control selectively the gain of any or all of the other channels.

In one form of the invention, the gain control system of an amplifier comprises a feedback circuit having a series light-sensitive resistor, for example, of cadmium sulfide. The gain control system further includes means for generating a gain control voltage and an incandescent lamp connected to said source of control voltage and disposed in a position to illuminate the light-sensitive resistor. In order to control the rate of change of gain, an adjustable shutter is provided between the lamp and the resistor. The adjustable shutter may be mounted on a threaded support to provide a fine adjustment of the masking of the resistor and thereby effect a precise adjustment of the gain/slope characteristic of the amplifier.

In a multi-channel amplifier system such, for example, as a multiplex signal amplifier in a radio receiver, each signal amplifier is provided with a gain control circuit as described which permits precise matching of the gain/slope characteristics of the respective channels. Since the characteristics are alike, or substantially identical, the gain control circuits may be interconnected so that all or any of the amplifier channels may be controlled by the gain control voltage of one of the channels, termed a master channel. In addition, switching means may be provided for interconnecting the gain control circuits of the respective channels so that any channel may be slaved to the master channel at will.

For a better understanding of the invention, reference may be had to the accompanying drawings illustrating a typical embodiment thereof. In the drawings, FIG. 1 is a schematic circuit diagram of a multiplex signal amplifier embodying the novel gain control system; and FIG. 2 is a graph illustrating the difference between the characteristics of gain control systems which have similar or dissimilar gain/slope characteristics.

Figure 2:
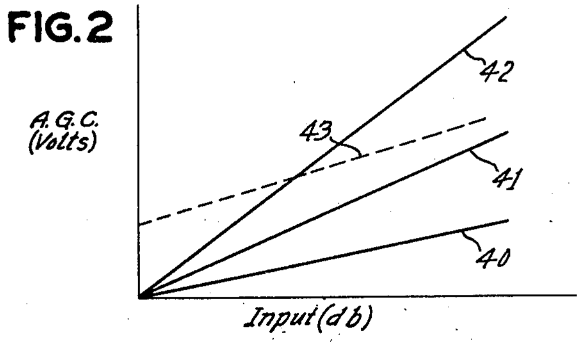

Referring to FIG. 1 of the drawings, a multiplex system is shown consisting of four amplifiers adapted to amplify four separate signals, thus constituting a multiplex signal amplifier. The circuits of only the first channel are shown in detail since the remaining channels may be similar. By way of example, an intermediate frequency amplifier for a radio receiver is shown in which the IF signal frequency is impressed upon the input conductor 10 and amplified by the transistors 11 and 12 of an automatic gain-controlled amplifier. The collector electrodes of the transistors 11 and 12 are connected to a positive terminal of battery 15 through a tuned circuit 16 and a resistor 17, respectively. The transistor circuit shown is conventional and may include a feedback circuit containing a series light-sensitive resistor 19 between the output of the transistor 12 and the emitter electrode of transistor 11 whereby the gain of the amplifier 11, 12 depends upon the resistance of the resistor 19. The resistor 19 may be a cadmium sulfide cell, for example, which changes in resistance when exposed to a varying intensity of light. The use of a light-sensitive resistor of this general character to control the gain of an amplifier is known in the art and requires no detailed explanation.

The output signal from the amplifier is impressed upon a detector 21 and an amplifier 22, for example, to provide an audio-frequency output signal in the output conductor 23. This specific application of the amplifier is, of course, shown by way of example and the amplifier embodying the invention may be employed in various other applications. The channels labeled #2, #3 and #4 may be assumed to be radio receiver amplifiers similar to the first channel for purposes of explanation. The output signal on the conductor 23 is amplified in an amplifier 25, rectified or detected by a detector 26, and the difference between the rectified signal and a steady dc reference signal is impressed upon the terminals of an incandescent lamp 28 through the contacts of a multiple-contact switch 30. The incandescent lamp 28 may be of the filamentary type, as shown, or any suitable type which generates a varying light output in response to changes in the gain control voltage from the detector 26 and thus varies the resistance of the resistor 19 to maintain the gain of the amplifier constant at a predetermined gain setting.

In order to control the rate of change of the gain of the amplifier, an adjustable masking device or shutter 31 is provided for partially intercepting light from the lamp 28 directed upon the light-sensitive resistor 19. As shown, the shutter 31 consists of a hollow sleeve 33, which is threaded in a supporting member 34 so that it may be precisely adjusted in position by hand or with a screw driver inserted into the slot at the end of the sleeve. Each of the channels is provided with a similar gain/slope control shutter so that the gain/slope characteristics of all channels may be precisely matched. This permits one of the channels to be used as a master channel to control the gain of the other or slave channels. Such an arrangement is advantageous where one channel is a telegraph channel and another channel is a voice channel since the gain control voltage of the telegraph channel is normally a steady control signal whereas the gain control voltage of a voice channel varies with the changes in the amplitude of the signal.

Switches 35, 36 and 37 are provided for channels #2, #3 and #4 in order to interconnect the gain control circuits. The switches 30–37 may be ganged together, as indicated by the dotted line 38 so that all of the channels may be controlled by the gain control voltage of any one channel, depending upon the position of the multiple-contact switch. On the other hand, switches 30, 35, 36 and 37 may be independently adjustable in a system where it is desired to control the gain of a channel either independently or by a master channel.

The graph of FIG. 2 shows the effect of varying the gain setting where the gain/slope control is either similar or dissimilar. The lines 40, 41 and 42 indicate the variation in the gain control voltage with input signal level for various positions of the adjustable shutter 31. The broken line 43 indicates the variation between the control voltage and the input signal level for a conventional gain adjustment which does not maintain the same gain/slope characteristic and it will be seen that this change in the gain/slope characteristic would prevent proper operation of a plurality of channels if it were attempted to control the gain in a slave channel by the gain control voltage variations of another channel. Thus in a conventional gain control system, if a change in the gain control adjustment of an amplifier were made to obtain the desired gain setting or output level, the relation between the control voltage and input signal level might change from that represented by the line 40 to that represented by the line 43. Therefore the particular gain setting or signal level desired would not be maintained over a normal variation of input signal.

As pointed out above, the gain control system may be utilized in various types of amplifiers or communication circuits employing amplifiers, and to control either a single amplifier or a multiplex signaling system. Various other modifications in the system shown and described in detail for the purpose of explaining the invention will occur to those skilled in the art and may be made without departing from the scope of the invention.

What is claimed is:

1. In a gain control system for an electron amplifier having input and output circuits, in combination,
   - means for controlling the gain of said amplifier, including a feedback circuit having a series light-sensitive resistor, said feedback circuit being connected to said amplifier output circuit,
   - a source of DC steady reference voltage,
   - a gain control detector connected to said source and to said amplifier output circuit,
   - an incandescent lamp adjacent said light-sensitive resistor and connected to said gain control detector to vary the resistance of said feedback circuit upon the occurrence of changes in the level of the signal in said amplifier output circuit, and
   - means for variably masking the light output of said lamp to change the gain rate-of-change characteristic of said amplifier, said last-mentioned means consisting of a movable shutter positioned by a threaded adjusting member for fine positional adjustment.

2. In a gain control system for multiplex channels carrying signaling currents, in combination,
   - a current amplifier in each channel,
   - gain control means for said amplifiers to maintain the desired signal level in each channel,
   - said gain control means including a feedback circuit for each amplifier having a series light-sensitive resistor, means for generating a gain control voltage which is a function of the output signal level of each amplifier, and a lamp connected to be responsive to each gain control voltage and disposed in a position to vary the illumination of the associated light-sensitive resistor,
   - an adjustable light-masking shutter between each lamp and the associated resistor for determining the gain/slope characteristic of each of said amplifiers, and
   - switching means for connecting the gain control voltage of one channel to the feedback circuit of another channel.

3. A gain control system according to claim 2, in which said switching means enables any one of said signaling channels to control the gain of all or any of the other channels.

References Cited

UNITED STATES PATENTS

| | | | |
|---|---|---|---|
| 2,374,204 | 4/1945 | Hoover | 330—124 X |
| 3,315,078 | 4/1967 | Deelman | 323—21 X |
| 3,379,991 | 4/1968 | Clerc | 330—59 |

RALPH D. BLAKESLEE, Primary Examiner

U.S. Cl. X.R.

323—21; 330—124